United States Patent
Kessel et al.

(10) Patent No.: US 10,439,641 B2
(45) Date of Patent: Oct. 8, 2019

(54) ERROR ESTIMATION IN SIGNAL COMMUNICATIONS

(71) Applicant: NXP B.V., Eindhoven (NL)

(72) Inventors: Martin Kessel, Dresden (DE); Sebastian Bohn, Dresden (DE); Jörg Andreas Siemes, Dresden (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/612,530

(22) Filed: Jun. 2, 2017

(65) Prior Publication Data

US 2018/0351573 A1  Dec. 6, 2018

(51) Int. Cl.
| | |
|---|---|
| *H04N 5/21* | (2006.01) |
| *H03M 13/01* | (2006.01) |
| *H04L 1/20* | (2006.01) |
| *H03M 13/25* | (2006.01) |
| *H04L 1/00* | (2006.01) |
| *H03M 13/03* | (2006.01) |
| *H03M 13/11* | (2006.01) |

(52) U.S. Cl.
CPC ......... *H03M 13/015* (2013.01); *H03M 13/01* (2013.01); *H03M 13/256* (2013.01); *H04L 1/0045* (2013.01); *H04L 1/203* (2013.01); *H04L 1/208* (2013.01); *H03M 13/03* (2013.01); *H03M 13/033* (2013.01); *H03M 13/11* (2013.01); *H04L 1/0054* (2013.01)

(58) Field of Classification Search
CPC ... H03M 13/015; H03M 13/256; H03M 13/03
USPC ....... 348/466, 462, 409.1, 425.2, 423.1, 180
See application file for complete search history.

(56) References Cited

U.S. PATENT DOCUMENTS

| | | | | |
|---|---|---|---|---|
| 6,404,891 | B1 * | 6/2002 | Seitz | H03G 3/347 381/107 |
| 2004/0027281 | A1 * | 2/2004 | Akopian | G01S 19/24 342/387 |
| 2007/0124625 | A1 | 5/2007 | Hassan et al. | |
| 2014/0335806 | A1 | 11/2014 | Kessel | |
| 2015/0092767 | A1 | 4/2015 | Kessel | |
| 2017/0149529 | A1 | 5/2017 | Lorca Hernando | |
| 2017/0169833 | A1 * | 6/2017 | Lecomte | G10L 19/20 |

* cited by examiner

*Primary Examiner* — Jefferey F Harold
*Assistant Examiner* — Jean W Desir
(74) *Attorney, Agent, or Firm* — Rajeev Madnawat

(57) ABSTRACT

Aspects of the disclosure are directed to processing signals including data exhibiting characteristics that facilitate assessment of transmission errors. As may be implemented in accordance with one or more embodiments, parameters are generated based signal transmission characteristics and are indicative of a different types of signal characteristics, including an amount of error correction that has been carried out on the signal. Two or more of the parameters are selected based on properties of signal disturbance under different reception conditions for the signal, and a degree of disturbance in the signal is predicted based on the selected parameters and signal conditions for the respective parameters at which the signal cannot be corrected. An output generated with the signal is then controlled, based on the predicted degree of disturbance and a threshold degree of disturbance.

21 Claims, 6 Drawing Sheets

ERROR ESTIMATION IN SIGNAL COMMUNICATIONS

OVERVIEW

Aspects of various embodiments are directed to signal communications, and in various implementations, to predicting communication errors.

Transmission of reliable data is important issue for wireless and wired transmission systems. Digital transmission systems often apply redundancy and forward error correction (FEC) or other data to their signals, so that the receiver can recover the transmitted digital sequence even when parts of the received signal are disturbed, or when there is significant noise on the received signal. For instance, a FEC may permit a receiver to detect one or more types of errors, and may further permit the receiver to correct those errors utilizing information in the FEC. When the disturbance exceeds a certain threshold, the output data often cannot be suitably corrected. Further, when such a threshold is exceeded the resulting output can be undesirable. For instance, where digital audio streams are being communicated, audible data being produced from the stream can be affected. Addressing such conditions can result in unnecessary interruption of audio streams, delays in ascertaining a different audio stream, and the production of sound that is distorted.

These and other matters have presented challenges to efficiencies of signal communication, for a variety of applications.

SUMMARY

Various example embodiments are directed to issues such as those addressed above and/or others which may become apparent from the following disclosure concerning communication of data, and ascertaining characteristics of the data transmission such as those that may relate to determining whether and/or when the data may degrade.

In certain example embodiments, aspects of the present disclosure involve generating parameters based on transmission-related characteristics of a signal, and utilizing a combination of such parameters to assess disturbance in the signal. Such approaches may be used to predict a condition or point at which a signal might degrade to a condition at which data in the signal may not be correctable, or exhibits characteristics beyond a threshold level of acceptance. For instance, audio streams may be processed and output for generating audible sound based on signal degradation. In this context, a point in time at which the audio stream may degrade below an acceptable level (e.g., where audio playback would be garbled or otherwise undesirable for listening) can be predicted, and this prediction can be used to determine a point at which action can be taken. Such action may include, for example, reducing volume, terminating audio playback, switching to another audio streaming source, or a combination of the above.

In a more specific example embodiment, signals including data exhibiting characteristics that facilitate assessment of transmission errors are processed as follows. A plurality of parameters are generated based on transmission-related characteristics of the signals, with each parameter being indicative of a type of signal characteristic that is different than a signal characteristic indicated by the other ones of the plurality of parameters. One or more of the parameters are indicative of an amount of error correction that has been carried out on the signal. Two or more of the plurality of parameters are selected based on properties of signal disturbance under different reception conditions for the signal. A degree of disturbance in the signal is predicted based on the selected parameters and signal conditions for the respective parameters at which the signal cannot be corrected. The output generated with the signal is controlled, based on the predicted degree of disturbance and a threshold degree of disturbance.

In another specific example embodiment, an apparatus includes a logic circuit, an audio source selection circuit and an audio output circuit. The logic circuit assesses an error criterion indicative of signal transmission errors for a signal communicated over a communications medium, and generates a signal quality output indicative of a degree of disturbance in the signal. The audio source selection circuit selects one of two or more audio sources based on the signal quality output from the logic circuit. The audio output circuit outputs audio data received from the selected audio source. In some embodiments, the logic circuit generates control outputs, such as a volume control output based on the assessed error criterion, and the audio output circuit controls a volume level of the output audio data, in response to the volume control output. A spectral properties control output can similarly be generated based on the assessed error criterion, and the audio output circuit can control spectral properties of the output audio data in response to the spectral properties control output. In certain embodiments, the logic circuit assesses an error criterion based on data indicative of transmission conditions for a communications medium over which the signal is communicated.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
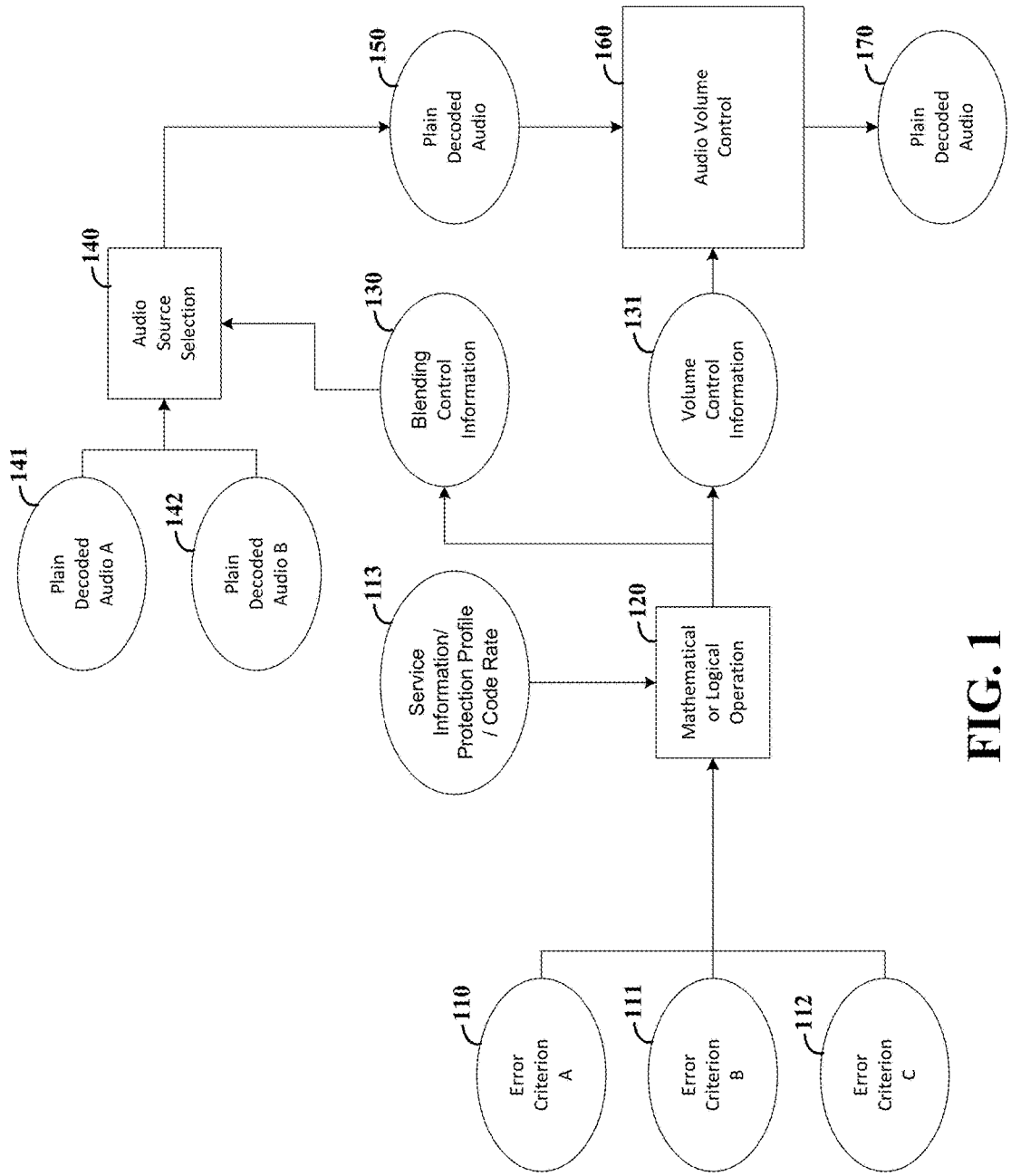
FIG. 1 is a system level diagram, as may be implemented with one or more aspects of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving signal communications, and including such communications that are subject to error, noise and other conditions that may present challenges to signal reception. Various embodiments involve inferring (e.g., digital) signal quality by combining disparate types of measures from forward error correction decoders. In certain implementations, aspects of the present disclosure have been shown to be beneficial when used in the context of audio signal communications, such as those in which a quality of the audio signal as used for audio playback at a receiver may be compromised to such a degree that quality of ensuing audio playback is compromised. In some embodiments, disparate signal characteristics are evaluated and used to predict signal quality degradation to a point that may render the signal unusable or uncorrectable. For instance, one or more of signal strength, signal-to-noise ratio, number of corrected bits, deviation of the received signal from a most likely reconstructed signal, and other characteristics related to forward error correction can be used together to predict issues with the signal. While not necessarily so limited, various aspects may be appreciated through the following discussion of non-limiting examples which use exemplary contexts.

Various specific details are set forth to describe specific exemplary embodiments presented herein. It should be apparent to one skilled in the art, however, that one or more other embodiments and/or variations thereof may be practiced without all the specific details given. In some instances, well known features have not been described in detail so as not to obscure the description of the examples herein. For ease of illustration, the same or similar reference numerals may be used in different diagrams to refer to the same or similar elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments are implemented in modern digital transmission systems that apply redundancy and error correction, such as forward error correction (FEC), to communicated signals. This facilitates recovery of the transmitted digital sequence at a receiver, even when parts of the received signal are heavily disturbed, or when there is significant noise on the received signal. When the disturbance exceeds a certain threshold, a codec may not be able to correct the output data any more. Depending on the error correction method and further methods used in the signal, it may or may not be possible to safely detect the point at which the system fails to correct the output signal. One or more such embodiments utilize parameters provided by the receiver, which respectively indicate some aspect of the quality of the received signal. For instance, different parameters may correlate with one or more of strength of the received signal, signal-to-noise ratio, number of corrected bits, or special values as may involve deviation of the received signal from a most likely reconstructed signal. In connection with one or more embodiments, it has been recognized/discovered that utilizing two or more of these parameters can provide a meaningful indication of whether the decoded (e.g., and error corrected) signal is identical (or nearly identical) to the transmitted signal, whether it still contains errors, or whether it was easily or hardly decodable. By applying a combination of these values, a good prediction of errors can be attained for the output signal. This prediction may, for example, be used to identify a margin to a point where such errors will occur.

In a particular embodiment, a digital transmission system as above is implemented for digital audio transmission. The characteristics of signal reception are utilized to predict a point at which a digital audio stream will degrade to a point at which adequate error correction cannot be carried out. For instance, where signal quality may be allowed to vary, a point at which the signal quality dips below a specified threshold can be predicted and used to achieve adequate audio playback. This approach may, for example, involve utilizing a different audio streaming source, such as by switching between audio signal delivery paths and/or networks via which the delivery may occur. For example, where digital audio is being streamed over a Wi-Fi network and that stream is degrading, signal reception can be controlled such that a device streaming the audio may switch over to a different network, such as a cellular telephone network, for streaming the digital audio. As another example, a broadcast radio receiver may switch over from high-quality digital radio broadcast to a standard AM or FM broadcast of the same content, when the digital radio stream is no longer receivable with sufficient quality. An audibly seamless transmission can be made.

In some embodiments, signal quality prediction as characterized above can also be used to predict when a signal having low quality will reach a threshold at which quality may improve to a sufficient level such that use of a received signal can be acceptable. For instance, utilizing the above digital audio streaming example, quality of the signal as received over a network that has degraded beyond an acceptable level can be monitored and, upon improving to an acceptable level, the signal can again be used at a receiver. One application, similar to the above example, involves a signal communicated over a Wi-Fi network that bears insufficient quality such that another network such as a cellular network is used to stream the audio signal. Upon prediction that the Wi-Fi signal will improve to a sufficient quality, operational changes can be effected to switch reception over to the Wi-Fi network at a point at which the predicted signal quality is sufficient. The same may apply for the above example of the broadcast network.

Various embodiments employ different measures of signal characteristics. Some embodiments employ signal characteristics ascertained in connection with error correction. Certain embodiments utilize forward error correction (FEC) codes to address errors that may occur, and FEC decoding at a receiver. Signal characteristics can be obtained in connection with such FEC decoding. For instance, FEC codes may generate redundant data, referred to as parity data, for data blocks prior to storage or transmission. After transmission or storage of a data block, the FEC code may use parity data to detect and/or recover errors present in data communicated therewith. Some example FEC codes include Hamming, Bose-Chaudhuri-Hochquenghem (BCH), Reed-Solomon, Trellis, and/or convolutional codes. Some error correction techniques use a combination of two or more FEC codes. Decoding in this context can be carried out in decoding circuitry at a receiver, which may detect different types of signal characteristics, such as those characterized herein.

Various approaches to predicting signal deviation beyond a point or threshold that is acceptable can be carried out to suit particular embodiments. For some applications, such prediction is carried out to estimate how close an FEC code is to failure (e.g., failure to correct). Using audio transmission such as digital broadcast radio as an example, actions can be taken before the FEC code fails to correct based on a prediction thereof. For instance, volume or audio bandwidth can be reduced, giving acoustic feedback indicating that the system is approaching the edge of reception. Such prediction may also be used for a gradual transition to an alternative audio source, before the current source becomes unavailable, such as by switching networks or by switching to a completely different audio source (e.g., a different digital broadcast station).

In various embodiments, one or more FEC decoders are used to provide different parameters indicating how much correction has been done. Parameters may indicate the strength of the received signal, the signal to noise ratio, the Bit Error Rate (e.g., the number of bits that were received as 1, but decoded as 0 or vice versa, over the overall number of received bits), metrics of the FEC decoder such as Viterbi path metrics, and special deviation values such as those indicative of the sum over soft bit deviations from decoded symbols over a certain period. For Viterbi path metrics, a Viterbi decoding algorithm that a branch metric (BM) and path metric (PM) can be used. The BM can provide an indication of a measure of distance (e.g., along a signal, in time) between what was transmitted and what was received. This can be defined, for example, for each arc in a trellis. The PM can provide a value associated with a state, such as a state in a trellis (a value associated with each node). For hard decision decoding, the PM may correspond to the Hamming distance over a most likely path from an initial state to a current state in a trellis. The most likely path can be defined as a path having a small or smallest Hamming distance between an initial state and a current state, measured over all possible paths between the two states. The path with the smallest Hamming distance can minimize the total number of bit errors. Using the Viterbi algorithm, a receiver can compute a PM for a (state, time) pair incrementally using the path metrics of previously computed states and the BM.

Various embodiments are directed toward utilizing a combination of parameters, as may represent hard bit and soft bit deviations between received and decoded symbols. Such parameters may increase when disturbances on a transmitted signal increase. A point where a received signal cannot be corrected and decoded correctly may yield different numbers for each of these parameters, which may also depend on the channel type. For example, in an additive white Gaussian noise (AWGN) channel with a quadrature amplitude modulation (QAM) modulation scheme, the number of corrected errors increases in parallel with violations of a soft bit threshold. For an erasure channel, the number of soft threshold violations may increase slowly when less than 15% of bits are erased, but exceed the number of hard bit corrections when more than about 20% of the bits are erased.

Accordingly, a measure for a likelihood of uncorrectable errors can be attained, or predicted, for a margin to a point at which an uncorrectable signal is presented, by combining one or more of a variety of error parameters. For instance, the point at which an uncorrectable signal is predicted to be received can be determined where any one parameter is above a configurable threshold, two or more parameters are above a configurable threshold, or a weighted average of the above parameters is above a configurable threshold. The combination of parameters used may be changed, depending on channel or reception conditions, which may be automatically detected by a system carrying out an analysis thereof. Values may also be combined to calculate a quality parameter, such as by always providing the measure of the worst parameter, always providing the measure of the best parameter, or providing a weighted average of above parameters. Further, the selection or combination scheme can be set/changed based on channel or reception conditions that are recognized by the system.

As noted above, embodiments herein may be applied in the context of the communication of digital audio information. Digital radio signal errors that cannot be corrected or are otherwise not corrected can lead to interruption of audio or data streams received in a corresponding receiver. An audio decoder might produce heavily distorted audio if audio data from an uncorrected stream is used to produce audible sound. The point at which uncorrectable errors occur is predicted using one or more approaches as characterized herein, and action can be taken accordingly, such as to switch to another audio source (e.g., another channel or network, or a completely different source), to reduce volume, or to otherwise alert a user of forthcoming (predicted) audio degradation. As consistent with various embodiments, it has been recognized/discovered that utilizing two or more parameters as characterized herein can result in a prediction that is highly accurate. These approaches can help avoid acting too early with regard to any correction steps taken, which may otherwise reduce user experience (e.g., unnecessarily interrupting audio playback may provide a negative experience and related market disadvantage). These predictive approaches can also avoid reacting too late on audio that is already distorted, which also leads to a lack of options for the receiver device and negative user experience, as lead time may be required for error compensation and mitigation, or, in some cases, for a smooth transition to silence.

In particular embodiments, a set or varying combination of hard and soft bit deviations that depend on channel or reception conditions are used to predict a point of uncorrectable errors. Depending on given conditions, this approach may noticeably shift the point of error concealment or other audible receiver reactions on reception errors. For some digital radio standards, this approach may provide addition time, perhaps a few hundred milliseconds, of additional good audio and/or warning before audio degrades past a threshold point.

Various embodiments are directed to methods and/or apparatuses involving signal processing, utilizing data exhibiting characteristics that facilitate assessment of transmission errors. Particular embodiments involve FEC error correction data. One or more parameters are generated based on transmission-related characteristics of the signals (e.g., decoding characteristics and/or properties of a transmission channel over which the signals are communicated). Each parameter is indicative of a type of signal characteristic that is different than a signal characteristic indicated by the other ones of the plurality of parameters. For instance, one of the parameters may be indicative of an amount of error correction that has been carried out on the signal, and another parameter may be indicative of signal strength, or signal-to-noise ratio. Two or more of the parameters are selected, based on properties of signal disturbance under different reception conditions for the signal (e.g., based on detected channel or reception conditions of the communicated signals). For instance, where a particular channel is susceptible to significant noise, a signal-to-noise ratio may be selected for use in determining one of the parameters. Accordingly, one or more characteristics such as signal strength, signal to noise ratio; bit error rate, Viterbi path metrics, and deviation of the signal from an expected value maybe utilized in this regard.

A degree of disturbance in the signal is predicted based on the selected parameters, and signal conditions for the respective parameters at which the signal cannot be corrected (e.g., an amount of error correction beyond which FEC cannot be carried out accurately). An output, such as audible sound, that is generated using the signal is controlled based on the predicted degree of disturbance and a threshold degree of disturbance.

Predicting the degree of disturbance may be carried out in a variety of manners. For instance, a point in the reception of the signal at which the signal will include uncorrectable errors (e.g., using an error correction code provided with the signal) can be identified. This point (e.g., a future time) can be used to proactively control the output. For instance, a transmission or reception characteristic by which the signal is transmitted or received can be altered in response to predicting the point in the reception of the signal at which the signal will include an uncorrectable error. Altering in this context may be carried out before reaching the predicted point in the reception of the signal, therein avoiding a condition under which the signal includes the uncorrectable errors. This approach may be used, for example, to switch to a different broadcast audio streaming source before a current source degrades beyond a particular threshold. The degree of disturbance may also be predicted by using respective thresholds for each of the selected parameters to predict the degree of disturbance, or by averaging the selected parameters and comparing the average to a threshold.

Various embodiments employ signals carrying a FEC, which is used to correct errors in the signal. One or more of the parameters is generated based on the error correction. For instance, an amount of error correction that is carried out to correct the errors in the signal can be determined and compared a threshold. The parameter can be generated based on the comparison (e.g., to indicate whether the signal is valid or should not be used).

An output generated with the signal can be controlled in a variety of manners. In some implementations, the output is modified in response to each of the selected parameters being above a respective threshold specific to the parameter, or in response to a weighted average of the selected parameters being above a configurable threshold.

In various embodiments, steps of generating parameters, selecting parameters and predicting a degree of disturbance are carried out for a plurality of channels over which the signals are received. One of the channels can be selected based on the predicted degree of disturbance for in the signal received via the channel. Accordingly, available channels can be evaluated and used based on this approach. The output can be generated with the signal received on the selected one of the channels.

Turning now to the Figures, FIG. 1 shows a system level diagram, as may be implemented with one or more embodiments. By way of example, FIG. 1 is characterized with audio data, but may be implemented with a variety of different types of data communications. Error criteria "A," "B," and "C" are provided at 110, 111 and 112 to block 120, which carries out a mathematical and/or logical operation utilizing at least two of the error criteria. Block 120 may, for example, implement the mathematical and/or logical operation utilizing data such as service information, a protection profile, or code rate as provided at 113. Blending control information 130 is output from block 120 and utilized at audio source selection block 140, which selects from decoded audio streams at 141 and 142, for providing decoded audio 150 as an output. This output may, for example, be provided to an audio volume control block 160, which also receives volume control information 131 from block 120. The volume control information can then be used by audio volume control block 160 to control a volume of output decoded audio at 170. A similar approach may be used for spectral properties control, such as by generating a spectral properties control output at block 160, based on the assessed error criterion, and controlling spectral properties of the decoded audio at block 170.

The operation at block 120 may, for example, involve determining that a potentially distorted (e.g., critical) or bad (e.g., failed) communication is present or imminent, based on one or more of the criteria (e.g., as may be with FIGS. 2 and 3 discussed below). The error criteria can be combined in a useful manner, which can be set based on the nature of the criteria and expected system behavior. For example, a system with two error criteria might first check the criteria against a threshold and then combine the results by logical operations. In this context, a system that characterizes audio reception to be good if one criterion is good, might play more audio before cutting out or reducing volume than a system which requires both criteria to be good, but may risk playing bad audio. However, a system that is more stringent in characterizing reception as good only when two (or more where appropriate) criteria are good may have less risk in playing bad audio but may unnecessarily cause audio to cut out or otherwise be altered.

Accordingly, block 120 can be implemented in a variety of manners, to suit particular embodiments, and can provide a tradeoff between audio quality and interruption of play. Any such tradeoff may also be set according to aspects of the system being implemented and/or available audio. For instance, where an alternate source of the data is readily available and can be switched to prior to interrupting audio, the tradeoff may be set to characterize audio as good when two (or more) criteria are detected as good. Under such circumstances, interruption can be avoided by switching to the alternate source. Where only one source is available, the threshold may be set for obtaining less interruption, while enduring a greater risk of playing bad audio.

The thresholds used for criterion checking and implementation at block 120 can be set based on the protection of the data during the transmission (protection profile/code rate). The result of the operation can control an audio volume (e.g., reduce audio level in case of bad reception) at block 160 and/or to decide to use an alternative audio source at block 140.

In various embodiments, fewer than all blocks shown in FIG. 1 are utilized. For instance, only two of the error criterion may be provided for certain embodiments, with both being utilized at block 120. Similarly, where all three criteria are provided, only two of the three may be utilized at block 120 to suit particular needs. Further, additional criterion can be provided and used. In some embodiments, only one decoded audio stream is provided, with the audio source selection block 140 and blending control information 130 being omitted, with the plain decoded audio 150 being that of whichever single source is provided. The output of block 120 is then utilized to effect audio volume control at block 160. Further, other actions in addition to and/or in lieu of the audio volume control at block 160 can be carried out, such as to provide an audible notification of a quality issue (or an expected quality issue). Moreover, as noted otherwise herein, communication of data other than audio can be controlled in a similar manner, with decoded data streams at 141 and 142 being of and/or including data other than audio, with block 140 operating as a data source selection. Audio volume control 160 is then implemented otherwise such as to provide an indication to a user or automated receiver of a detected or expected data quality issue.

Figure 2:
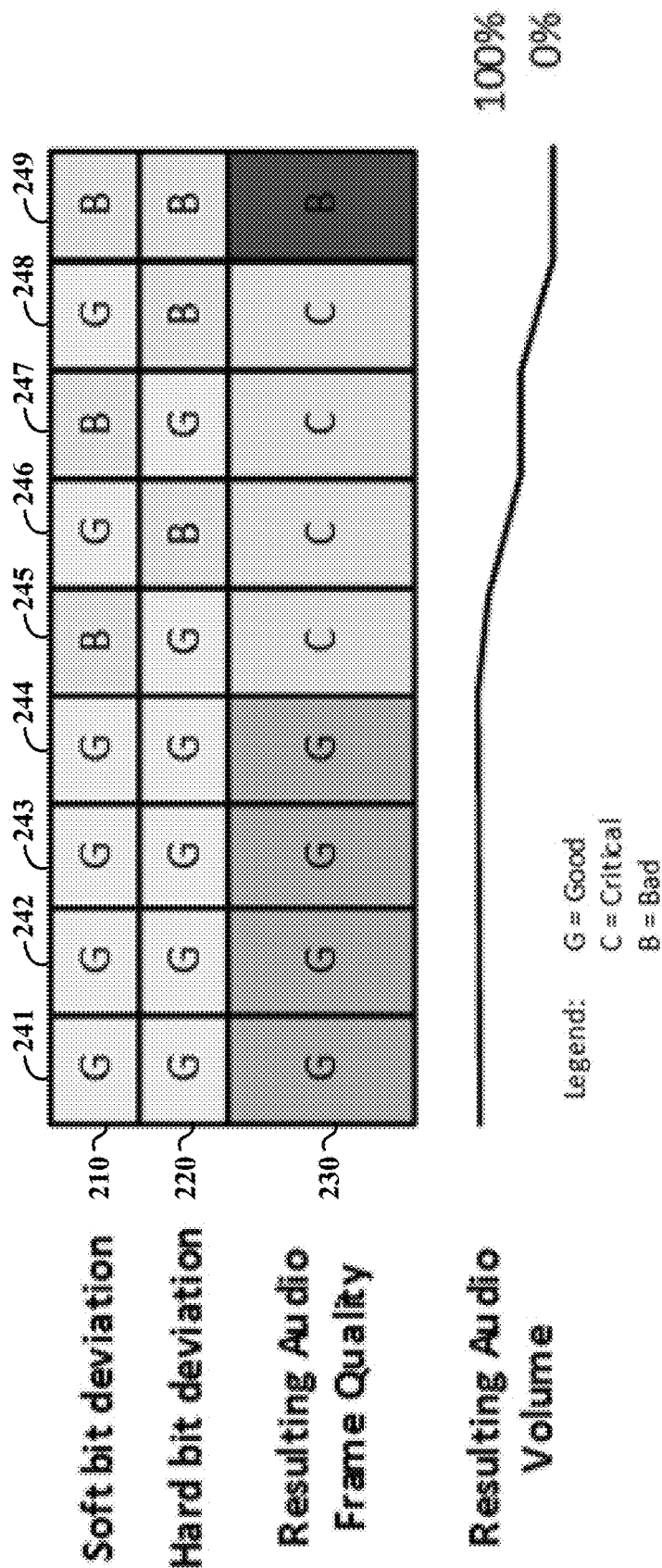
FIG. 2 shows an approach for characterizing received transmissions, as may be implemented in accordance with the present disclosure.
Figure 3:
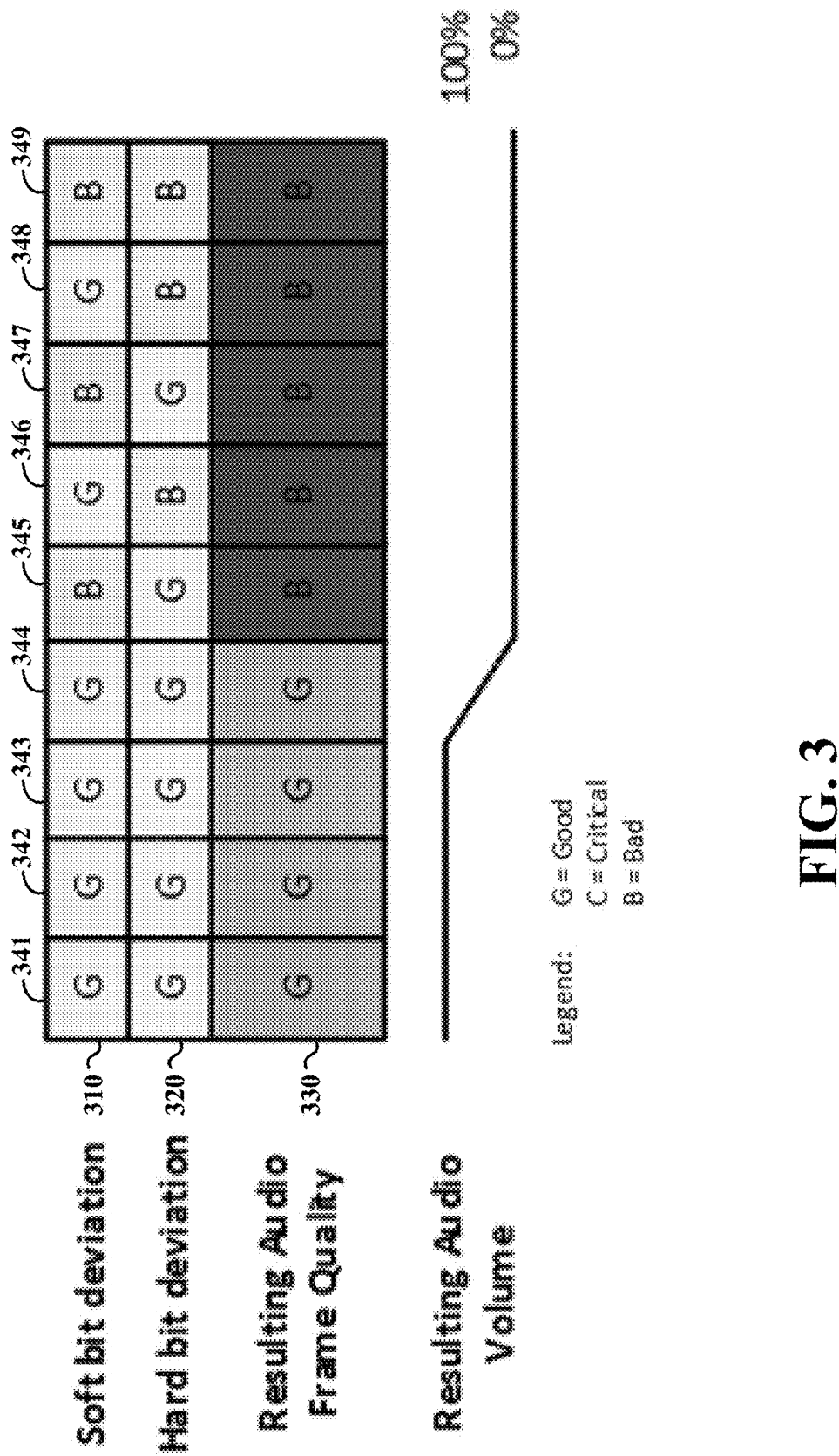
FIG. 3 shows an approach for characterizing received transmissions, as may be implemented in accordance with the present disclosure.

FIGS. 2 and 3 show respective approaches for characterizing received transmissions, as may be implemented in accordance with one or more embodiments. While audio signals are characterized by way of example, various signal types can be evaluated in a manner not inconsistent with the respective approaches. Here, "good" (G), "critical" (C), and "bad" (B) assessments are made for respective frames. Specifically, FIG. 2 shows a flexible combination of parameters and FIG. 3 shows a static combination approach. In FIG. 2, one of two parameters being bad (e.g., beyond a threshold) results in an assessment of the audio frame quality as being critical, with the audio frame quality being assessed as bad when both parameters are bad. As a particular implementation, soft bit deviation for respective bits is shown as being assessed at 210, hard bit deviation for the same bits at 220, and a resulting audio frame quality is assessed at 230. At 241, 242, 243 and 244, both the hard and soft bit deviations are assessed as "good," resulting in the audio frame quality being assessed as good. At each of 245 and 247, the soft bit deviations are assessed as "bad" while the hard bit deviations are assessed as "good," resulting in the audio frame quality being assessed as "critical." Similarly at 246 and 248, the hard bit deviations are assessed as "bad" while the soft bit deviations are assessed as "good," resulting in the audio frame quality again being assessed as "critical." At 249, both the hard and soft bit deviations are assessed as being bad, in response to which the resulting audio frame quality is also assessed as bad.

In FIG. 3, deviation in any of the two parameters being assessed as "bad" results in an assessment of frame audio quality as being bad. Similar to FIG. 2, soft bit deviation for respective bits is shown as being assessed at 310, hard bit deviation for the same bits at 320, and a resulting audio frame quality is assessed at 330. At 341, 342, 343 and 344, both the hard and soft bit deviations are assessed as "good," resulting in the audio frame quality being assessed as good. At 345, 346, 347, and 348 one of the soft bit and hard bit deviations is assessed as "bad" while the other of the soft bit and hard bit deviations is assessed as "good," resulting in the audio frame quality being assessed as "bad." At 349, with both the soft bit and hard bit deviations being assessed as "bad," the audio frame quality is again assessed as "bad."

By way of example, the assessment of audio frame quality as characterized in one or both of FIGS. 2 and 3 may be processed by reducing a resulting audio volume relative to the quality, as an indicator or nuisance avoidance to the listener as the assessment goes from good (100% volume), to critical (reduced volume) and to bad (no volume). Volume may similarly be restored, upon recovery to an assessment of better frame quality. This is shown by way of example for each figure, relative to 241-249 and 341-349.

Figure 4:
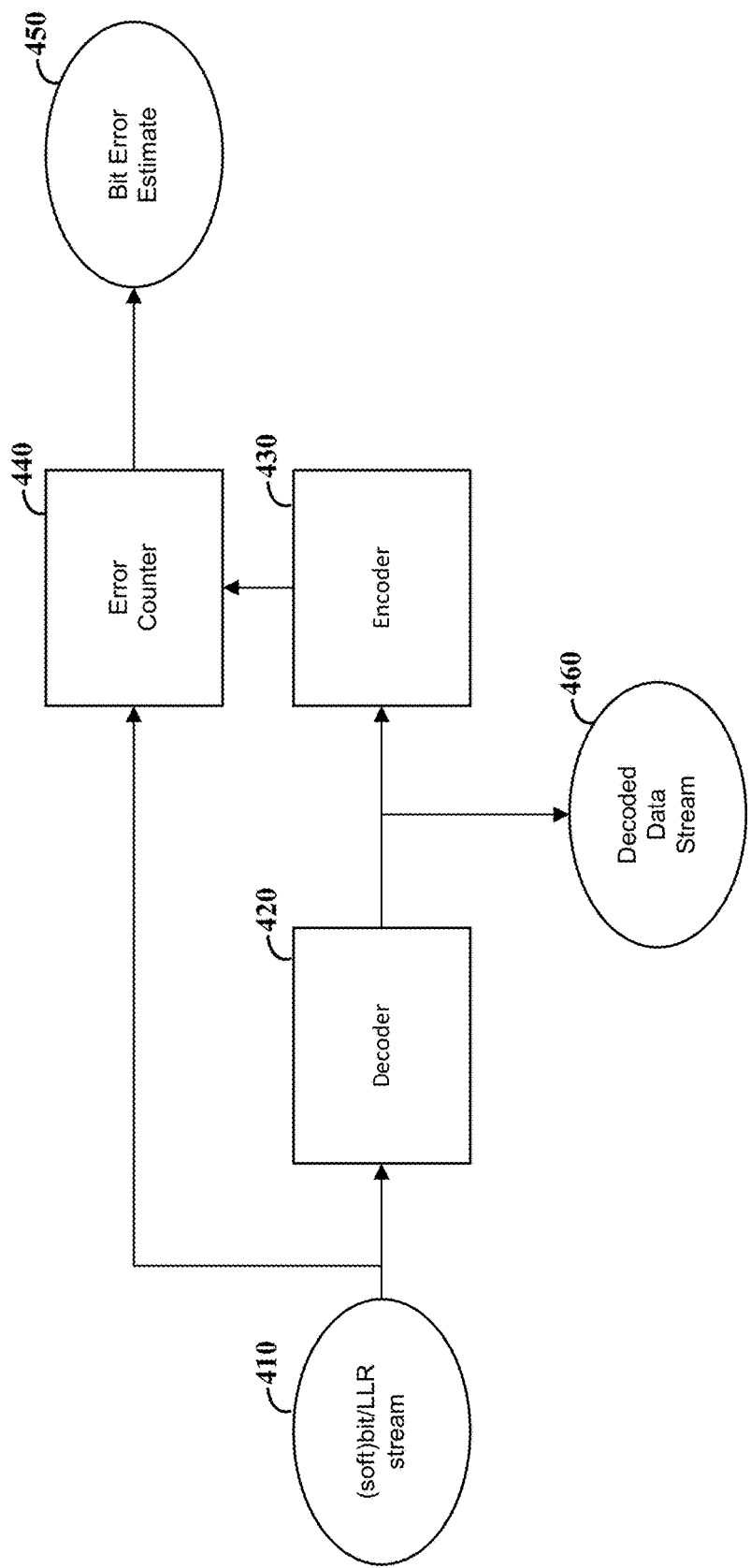
FIG. 4 shows an approach that may be implemented for calculating a pseudo bit error estimate, in accordance with the present disclosure.

Various embodiments utilize one or more soft error (or bit error) type correction approaches, in generating one or more parameters based on FEC decoding. FIG. 4 shows an approach that may be implemented for calculating a pseudo bit error estimate, as may correspond to an estimate of the bit errors of transmitted encoded data in data stream 410. A decoder 420 decodes the data stream 410 and presents the decoded stream for use at 460. The decoded stream is also presented to encoder 430, which re-encodes the data for use by error counter 440. For instance, by assuming the decoder is correcting most errors, the re-encoded data can be compared with the incoming data stream 410 at the error counter 440, and the comparison can be used to generate a bit error estimate at 450. Soft error estimation may be used in connection with a Viterbi decoder at 420, which follows a trellis graph and may produce burst errors (no single bit error in the output stream). The history of the bits and the soft information can be used to estimate the probability of a correct output bit. These estimates may, for example, be provided as a parameter for use in evaluating the data stream, such as one of the error criteria 110, 111 and 112 of FIG. 1.

Figure 5:
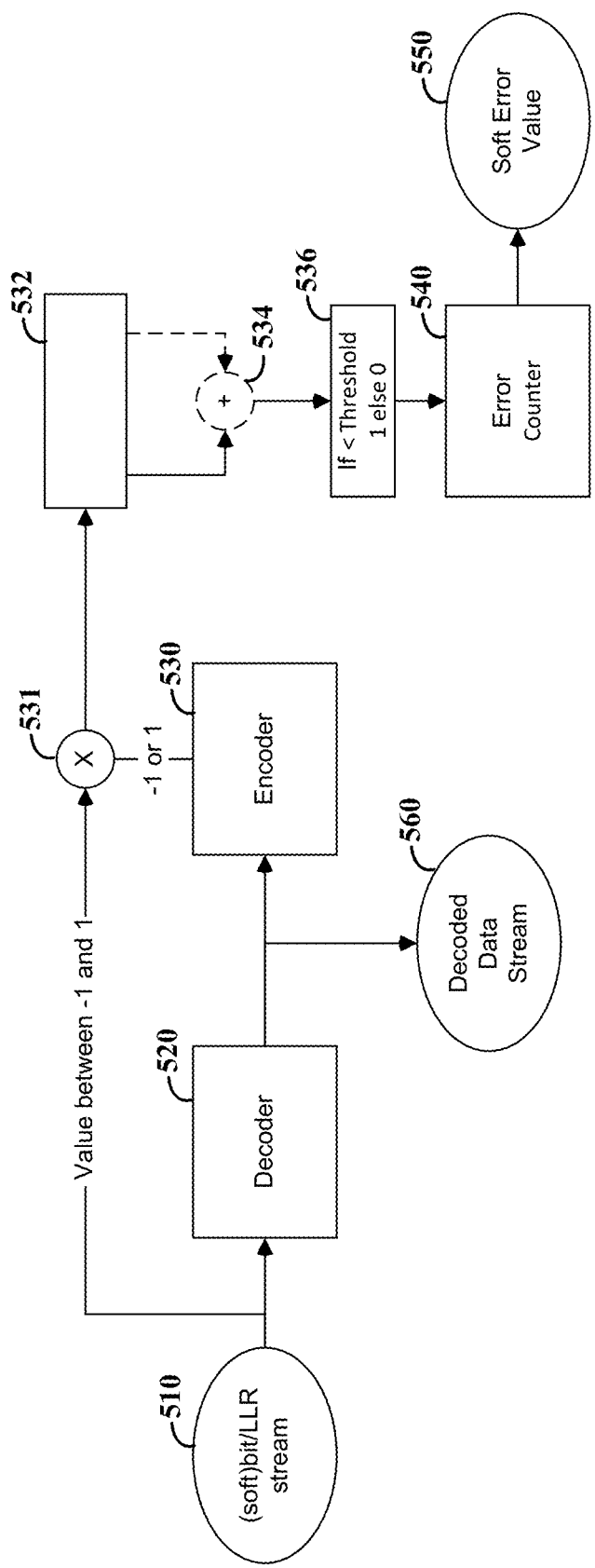
FIG. 5 shows an approach for estimating the probability of obtaining a correct output bit, and for generating a quality indicator for an incoming data stream, in accordance with the present disclosure.

FIG. 5 shows an approach for estimating the probability of obtaining a correct output bit, and for generating a quality indicator for an incoming data stream 510, as may be implemented in accordance with one or more embodiments. A decoder 520 (e.g., a Viterbi or Bahl-Cocke-Jelinek-Raviv (BCJR)) decodes the data stream and presents the decoded data stream at 560. An encoder 530 (e.g., convolutional) re-encodes the decoded data stream, which presents values of −1 or 1 for combination at 531 with the value (between −1 and 1) of the incoming data stream 510, which is used to produce one or more outputs at block 532 (that can be added at 534 where more than one is produced) and compared to a threshold at 536. If the result is less than the threshold, an output of 1 is provided, otherwise an output of zero is provided (these outputs can be reversed, with an opposite action taken). Error counter 540 then counts errors based on the output from 539, which is used to provide a soft error value 550.

Figure 6:
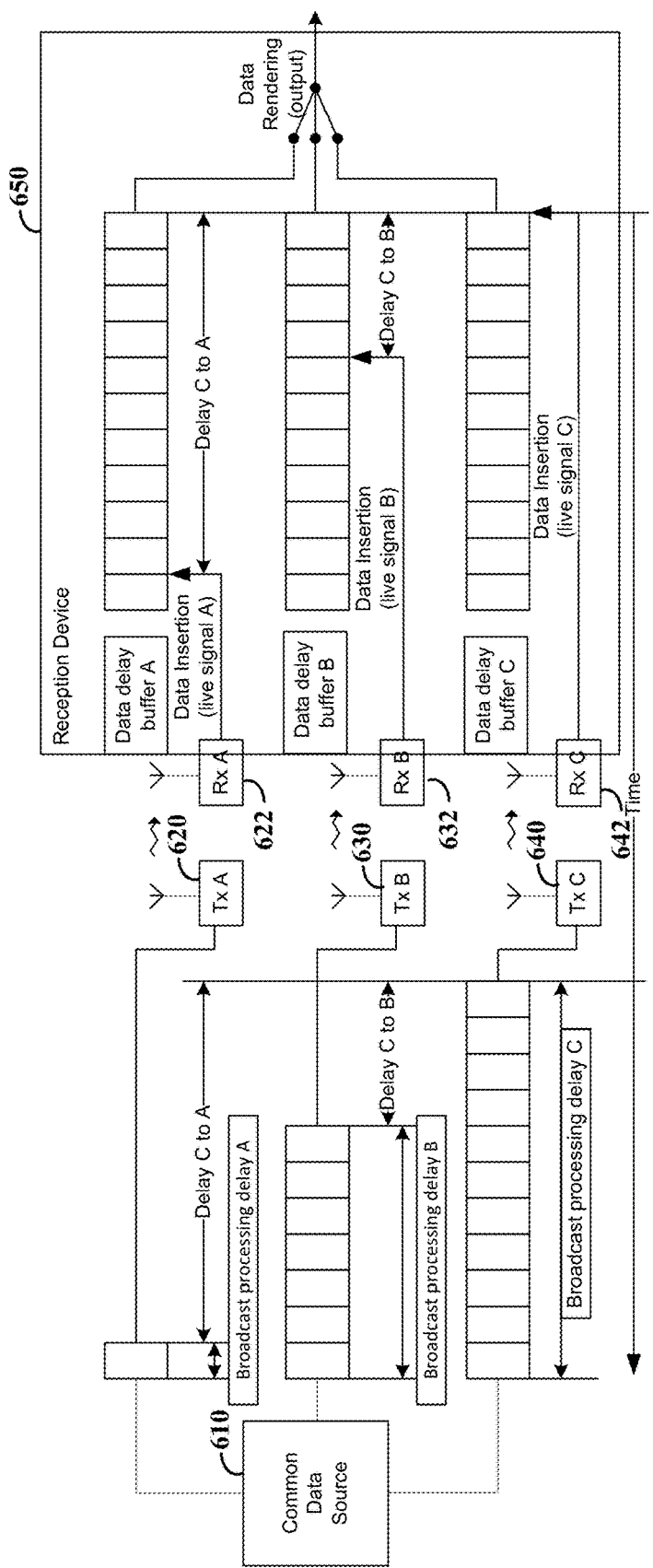
FIG. 6 shows an approach for blending data streams, as may be implemented in accordance with one or more aspects of the present disclosure.

FIG. 6 shows an approach for blending data streams, as may be implemented in accordance with one or more embodiments. Data stream blending may be carried out, for example, as part of a transition process carried out for switching between respective data stream sources in response to predicted disturbance in one of the data stream sources, for switching to the other one of the data stream sources. Data from a common data source 610 is transmitted via transmitters 620, 630 and 640, and the data is respectively received via receivers 622, 632 and 642 of reception device 650. Broadcasting delays on the transmitter side may be compensated by buffer delays on the receiver side to enable a seamless transition between identical audio streams that are transmitted with different delays.

Such approaches to blending can be used with modern broadcast receivers that support multiple audio inputs from different broadcast domains, such as AM, FM, DAB, and Internet radio. These sources are often not aligned in time due to varying broadcast processing delays, but seamless transition between them is still possible if sources have been aligned in time on the receiver side. In some implementations, the reception device 650 may keep a secondary source on "hot standby" (active and aligned) to be able to seamlessly switch or blend to this alternative whenever the currently played source breaks away. Since different broadcast domains may offer different overall quality, such as digital audio quality being better than analog quality, the transition point can be carefully determined for a desirable listening experience. For instance, transition (blending) from digital to analog can be set to occur as late as possible for maximum audio quality, but early enough to still allow a seamless cross-fade with remaining good digital audio samples. This can be based on a prediction of a point in time where the digital signal may deteriorate beyond a particular threshold, as characterized with one or more embodiments herein, and utilizing improved accuracy for the prediction.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, transmitter, receiver, encoder, decoder, counter, and/or other circuit-type depictions (e.g., reference numerals 120, 140 and 160 of FIG. 1 depicts blocks/modules as described herein). Such circuits or circuitry are used together with other elements to exemplify how certain embodiments may be carried out in the form or structures, steps, functions, operations, activities, etc. For example, in certain of the above-discussed embodiments, one or more illustrated items in this context represent circuits (e.g., discrete logic circuitry or (semi-) programmable circuits) configured and arranged for implementing these operations/activities, as may be carried out in the approaches shown in FIGS. 1-6. For instance, block 120 may be carried out using a logic circuit that executes code to assess the respective error criterion, and generate blending control information 130 and volume control information 131, which can utilize data at 113 to do so. In certain embodiments, such illustrated items represent one or more computer circuitry (e.g., microcomputer or other CPU) which is understood to include memory circuitry that stores code (program to be executed as a set/sets of instructions) for performing a basic algorithm (e.g., Viterbi decoding) or the more complex processes/algorithms as described herein to perform the related steps, functions, operations, activities, etc. The specification may also make reference to an adjective that does not connote any attribute of the structure ("first [type of structure]" and "second [type of structure]") in which case the adjective is merely used for English-language antecedence to differentiate one such similarly-named structure from another similarly-named structure (e.g., "first circuit configured to convert . . . " is interpreted as "circuit configured to convert . . . "). On the other hand, specification may make reference to an adjective that is intended to connote an attribute of the structure (e.g., monitor server), in which case the adjective (e.g., error) modifies to refer to at least a portion of the named structure (e.g., counter) configured to have/perform that attribute (e.g., error counter refers to at least a portion of an electronic circuit that includes/performs the attribute of error counting).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, fewer or more parameters may be used, in different combinations, to ascertain signal quality. As another example, fewer than all components shown in the figures, such as in FIG. 1, may be implemented as separate embodiments. In addition, further sources can be used and blended or selected, to suit particular implementations. Such modifications do not depart from the true spirit and scope of various aspects of the disclosure, including aspects set forth in the claims.

What is claimed is:

1. A method for processing signals including data exhibiting characteristics that facilitate assessment of transmission errors, the method comprising:
    generating a plurality of parameters based on transmission-related characteristics of the signals, each parameter being indicative of a type of signal characteristic that is different than a signal characteristic indicated by the other ones of the plurality of parameters, at least one of the parameters being indicative of an amount of error correction that has been carried out on the signals;
    selecting at least two of the plurality of parameters based on properties of signal disturbance under different reception conditions for the signals;
    predicting a degree of disturbance in the signals based on the selected at least two of the plurality of parameters and signal conditions for the respective parameters at which the signals cannot be corrected; and
    controlling an output generated with the signals, based on the predicted degree of disturbance and a threshold degree of disturbance.

2. The method of claim 1, wherein the transmission characteristics include one or both of decoding characteristics and properties of a transmission channel over which the signals are communicated.

3. The method of claim 1, wherein selecting at least two of the plurality of parameters includes selecting at least one of the parameters that is indicative of at least one of: signal strength, signal to noise ratio; bit error rate, and deviation of the signals from an expected value.

4. The method of claim 1, wherein predicting the degree of disturbance in the signals includes predicting a point in the reception of the signals at which the signals will include errors that are uncorrectable using an error correction code provided with the signals.

5. The method of claim 4, further including altering a transmission characteristic or a reception characteristic by which the signals are transmitted or received, in response to the step of predicting a point in the reception of the signals at which the signals will include an uncorrectable error.

6. The method of claim 5, wherein altering the transmission characteristic or the reception characteristic is carried out before reaching the predicted point in the reception of the signals, therein avoiding a condition under which the signals includes the uncorrectable errors.

7. The method of claim 1, wherein predicting the degree of disturbance in the signals includes using respective thresholds for each of the selected parameters to predict the degree of disturbance.

8. The method of claim 1, wherein predicting the degree of disturbance in the signals includes averaging the selected parameters, and comparing the average to a threshold.

9. The method of claim 1, wherein
    the signals include a forward error correction code (FEC),
    generating the plurality of parameters includes using the FEC to correct errors in the signals, and generating at least one of the plurality of parameters based on the error correction.

10. The method of claim 9, wherein generating the at least one of the plurality of parameters based on the error correction includes determining an amount of error correction that is carried out to correct the errors in the signals, comparing the amount of error correction to a threshold, and generating the parameter based on the comparison.

11. The method of claim 1, wherein controlling the output generated with the signals includes modifying the output in response to each of the selected parameters being above a respective threshold specific to the parameter.

12. The method of claim 1, wherein controlling the output generated with the signals includes modifying the output in response to a weighted average of the selected parameters being above a configurable threshold.

13. The method of claim 1, wherein selecting the at least two of the plurality of parameters based on properties of signal disturbance under different reception conditions for the signals includes selecting the parameters based on detected channel or reception conditions of the communicated signals.

14. The method of claim 1, further including, in response to the predicted degree of disturbance exceeding the threshold degree of disturbance, switching to a new transmission source for the signals prior to a time at which the predicted degree of disturbance will occur.

15. The method of claim 1,
wherein the steps of generating, selecting and predicting are carried out for a plurality of channels over which the signals are received,
further including selecting one of the channels based on the predicted degree of disturbance in the signal received via the channel, and
wherein controlling the output includes generating an output with the signal received on the selected one of the channels.

16. The method of claim 1,
wherein the steps of generating, selecting, predicting and controlling are carried out by a logic circuit to assess error criterion indicative of signal transmission errors for a signal communicated over a communications medium, and to generate a signal quality output indicative of a degree of disturbance in the signal;
selecting one of at least two audio sources based on the signal quality output; and
outputting audio data received from the one of the at least two audio sources.

17. The method of claim 16,
wherein the logic circuit is to generate a volume control output based on the assessed error criterion; and
the step of outputting audio data is carried out by an audio output circuit to control a volume level of the audio data, in response to the volume control output.

18. An apparatus for processing signals including data exhibiting characteristics that facilitate assessment of transmission errors, the apparatus comprising:
a first circuit configured and arranged to generate a plurality of parameters based on transmission-related characteristics of the signals, each parameter being indicative of a type of signal characteristic that is different than a signal characteristic indicated by the other ones of the plurality of parameters, at least one of the parameters being indicative of an amount of error correction that has been carried out on the signals;
a second circuit configured and arranged to select at least two of the plurality of parameters based on properties of signal disturbance under different reception conditions for the signals;
a third circuit configured and arranged to predict a degree of disturbance in the signal based on the selected at least two of the plurality of parameters and signal conditions for the respective parameters at which the signals cannot be corrected; and
a fourth circuit configured and arranged to control an output generated with the signals, based on the predicted degree of disturbance and a threshold degree of disturbance.

19. The apparatus of claim 18, wherein the first, second and third circuits are part of a logic circuit that carries out instructions by executing code that causes the logic circuit to carry out the indicated functions of the first, second and third circuits.

20. The apparatus of claim 18,
wherein the first, second and third circuits are part of a logic circuit to assess error criterion indicative of signal transmission errors for a signal communicated over a communications medium, and to generate a signal quality output indicative of a degree of disturbance in the signal; and further comprising:
an audio source selection circuit to select one of at least two audio sources based on the signal quality output; and
an audio output circuit to output audio data received from the selected one of the at least two audio sources.

21. The apparatus of claim 20, wherein
the logic circuit is to generate a volume control output based on the assessed error criterion; and
the audio output circuit is to control a volume level of the output audio data, in response to the volume control output.

* * * * *